HIGH-FREQUENCY TRANSISTOR CIRCUIT

Filed June 19, 1952 3 Sheets-Sheet 1

INVENTOR
R. L. WALLACE JR.
BY Harry C. Hart
ATTORNEY

INVENTOR
R. L. WALLACE JR.
BY Harry C. Hart
ATTORNEY

INVENTOR
R. L. WALLACE JR.
BY Harry C. Hart
ATTORNEY

United States Patent Office 2,695,930

Patented Nov. 30, 1954

2,695,930

HIGH-FREQUENCY TRANSISTOR CIRCUIT

Robert L. Wallace, Jr., Plainfield, N. J., assignor to Bell Telephone Laboratories, Incorporated, New York, N. Y., a corporation of New York Application June 19, 1952, Serial No. 294,298

10 Claims. (Cl. 179—171)

This invention relates to semiconductor signal translating devices and more particularly to such devices of the class now known as transistors. It has for its principal object the extension of the frequency range of operation of such devices.

In general, a transistor comprises a body of semiconductive material having three connections thereto, termed the emitter, the collector, and the base. In one manner of operation, signals are impressed between the emitter and the base and amplified replicas thereof appear in a load circuit connected between the collector and the base. The devices may be of any one of several specifically different types. In one, of which the devices disclosed in Patent 2,524,035, granted October 3, 1950, to J. Bardeen and W. H. Brattain are illustrative, the emitter and collector connections are point contacts. In another, of which the devices disclosed in an article by Shockley, Pearson, and Haynes, published in the Bell System Technical Journal, July 1949, pages 435 et seq. and in Patent 2,569,347, granted September 25, 1951, to W. Shockley are illustrative, either the emitter or the collector or both includes a junction between two zones of opposite conductivity type in the semiconductive body. Such a junction is commonly designated a P–N (or N–P) junction and is so referred to herein. Techniques for fabricating such a unit are described in an application of G. K. Teal, Serial No. 168,184, filed June 15, 1950.

Operation of a transistor entails, in general, injection into the body or into a zone thereof, and at the emitter, of charge carriers of the sign opposite that of the carriers normally in excess in the body or zone and flow of the carriers to the collector.

Understanding and appreciation of this invention may be facilitated by a consideration of some salient principles involved in the functioning of semiconductor translating devices. In general, semiconductors, whether elemental, such as germanium or silicon, or compounds, such as copper oxide, may be classified as to conductivity type, that is N or P, N-type material being that which, when associated with a metallic connection, exhibits low impedance to current flow when it is negative relative to the connection and exhibits high impedance when it is positive relative to the connection. P-type material, conversely, exhibits low impedance when it is positive relation to the connection and high impedance when it is negative. When a junction between a connection and a semiconductor or between two semiconductors of opposite conductivity types is polarized in the direction of easy current flow, it is said to be biased in the forward direction. When it is poled to present a high impedance it is said to be biased in the reverse direction.

Conduction in semiconductors of the type usually employed, i. e., extrinsic semiconductors, occurs by virtue of either negative charges, i. e., electrons, or of virtual positive charges or "holes," one being normally in excess of the other in the semiconductive material. Specifically, in N-type semiconductors the carriers normally in excess are electrons and conduction is by movement of electrons; in P-type material, holes normally are in excess and conduction is by movement of holes. The charge carrier normally in excess is associated with the class of significant impurities in excess in the semiconductive material. Specifically, donor impurities contribute excess electrons whereas acceptor impurities produce excess holes. As is known, the number of excess impurity centers determines the conductivity of the material, the conductivity increasing as the impurity content increases.

The so-called N–P–N (or P–N–P) transistors of the Shockley patent above mentioned have a number of properties of interest for circuit applications of many varieties. Among these are a relatively low noise factor, freedom from short circuit instability, high power gain, low internal power dissipation, freedom from microphonics, high efficiency, excellent power handling capacity, ability to operate with an exceedingly small internal consumption of power and with very small bias sources, ruggedness, and small size. For the purpose of many applications, two especially important features of these transistors are that their current multiplication factors are very slightly less than unity and that their collector resistances are high. Their characteristics have been fully described in an article by R. L. Wallace, Jr., and W. J. Pietenpol, published in the Bell System Technical Journal for July 1951, volume 30, page 530.

Transistors have already found their place in switching circuits, audio-frequency circuits, and relatively low radio frequency circuits. To date, however, they have been limited in their utility at the very high radio frequencies by two principal factors: First, a relative sluggishness of the motion of charge carriers from the emitter to the collector, relatively at least to the high speed of movement of electrons in a vacuum tube, manifests itself as a time lag of the output signal as compared with the input signal. It gives rise to what are known as "transit time" effects and they are most pronounced and therefore most serious, in transistors of the internal junction variety. Second, the so-called base resistance $r_b$ of the transistor is in many connections an undesirable feature and various attempts have been made to reduce it. In general the base resistance of a junction transistor as fabricated by the best available techniques is of the order of 1000 ohms, i. e., several times as great as the base resistance of a typical contact transistor. High base resistance seriously restricts the upper frequency limit of satisfactory operation, especially when the current multiplication factor $\alpha$, is close to unity as is generally the case with junction transistors.

Accordingly, a more specific object of the present invention is to reduce the base resistance of transistors in general and of junction transistors in particular.

In one aspect, the invention provides a transistor which is a structural compromise between the junction transistor of the Shockley patent and the point contact transistor of the Bardeen-Brattain patent and which retains the above-mentioned desirable characteristics of the junction transistor while substituting the lower base resistance and shorter transit time of the point contact transistor. This structural compromise is attained by a many-fold reduction in the cross sectional area of the emitter junction or the collector junction or both, thereby restricting the active portion of the junction to an area so small that it is in effect a point and thus exhibits the characteristics of a point contact. The area of one of the internal junctions of an N–P–N transistor as fabricated according to the teachings of the aforementioned application of G. K. Teal is of the order of one square millimeter. In accordance with the present invention, this area is reduced to about 1/100 square millimeter. Furthermore, by appropriate control of the process of area reduction, the residual active area is restricted to that part of the original area which lies closest to the base connection of the transistor, from which it follows that the transistor base resistance is greatly reduced in magnitude.

The junction area may be reduced by a novel etching process which removes material from the emitter zone or the collector zone or both immediately adjacent the junction. This provides a further incidental advantage in that the input and output capacitances of the transistor, which are principally due to the emitter and collector junctions respectively, are also reduced.

In another aspect, the invention utilizes an auxiliary base electrode, located opposite to the main base electrode. It is grounded in the discovery that with a potential of appropriate magnitude and sign applied between these two base electrodes, giving rise to a transverse current through the base zone of the transistor, the base resistance, and perhaps also the transit time for injected charges across the base zone are both reduced. The auxiliary potential difference transversely of the base zone combines with the lesser potential difference normally present between the normal base connection and the emitter connection to disable the greater part of the area of the emitter junction, leaving only a comparatively small portion of the active area as an emitter. Because this residual active portion lies immediately adjacent to the normal base connection, the effective base resistance of the transistor as a whole is much reduced.

This electrical restriction of the active area of the emitter junction may supplement the physical restriction produced, for example, by the etching process, or it may be employed independently.

While the auxiliary potential difference and transverse current do not noticeably affect the collector junction and do not reduce the input capacity across the emitter junction but rather increase it somewhat, they have been found to result in an increase of the high frequency cut-off of a transistor amplifier by as much as 15 times, and self-oscillations have been sustained with a transistor constructed and biased in accordance with the invention and connected as an element of a straightforward oscillator circuit at frequencies as high as 65 megacycles per second.

As an additional feature, the transit time of mobile charges from the residual active area of the emitter junction, across the base zone to the collector junction can be still further reduced by the application of a magnetic field in a direction which is perpendicular both to the line joining the emitter to the collector and to the current which flows in the base zone between the main base electrode and the auxiliary base electrode. The magnetic field acts to produce a Hall-effect deflection of the auxiliary base zone current toward the collector junction and so to accelerate the transfer of mobile charges originating at the emitter junction to the collector contact.

The invention will be fully apprehended from the following detailed description of preferred embodiments thereof taken in connection with the appended drawings in which.

Figure 1:
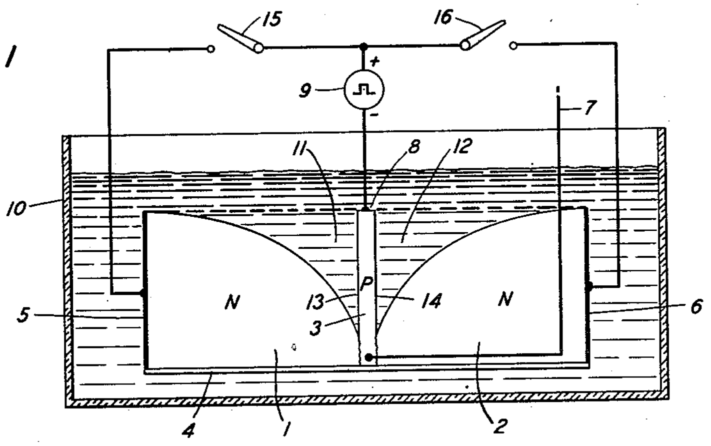
Fig. 1 shows an N–P–N junction transistor to which an auxiliary base electrode has been added and in which the areas of the emitter and collector junctions have been physically reduced in accordance with one aspect of the invention and apparatus for effecting such a reduction.

Referring now to the drawings, Fig. 1 shows in dotted outline an N–P–N junction transistor as fabricated for example in accordance with the teachings of the aforementioned Teal application. It has an emitter zone 1 and a collector zone 2 each of N-type material and an intermediate base zone 3 of P-type material. One face of this transistor, namely the lower face in the drawing, is first covered with a protective coating 4 of shellac, wax, lacquer or the like while another face, for example the upper face in the drawing, is left clean. It is provided with the customary emitter and collector connections to the N-type zones 5, 6 and with the normal base connection 7 to the intermediate P-type zone. It is provided, in addition, with an auxiliary base connection 8 to the intermediate zone 3 and a pulse source 9 is connected between the auxiliary base connection 8 and either the emitter connection 5 or the collector connection 6 or both, the negative terminal of the source 9 being connected to the intermediate base zone 3 and the positive terminal to either or both of the end zones 1, 2. (In the case of a P–N–P transistor whose end zones are of P-type material while its intermediate zone is of N-type material, the polarity of the pulse source is reversed.) The transistor is immersed in a bath 10 of a liquid electrolyte, preferably acidic, although an alkaline electrolyte also serves. Application of the voltage of the source 9 results in a removal of the semiconductor material from regions 11, 12 of the end zone or zones lying immediately adjacent to the junctions or barriers 13, 14, the process commencing at the clean side of the transistor and progressing inward into the body. If it is desired to etch the material away from only one side, the three other sides should be provided with protective coating. If preferred, the etching may proceed from three sides, in which case only one side is so protected. Any source of current would serve in principle but in practice a pulse source is preferred because it provides high voltage and heavy current for brief intervals and so carries out the etching process rapidly without undue heating of the transistor or of the etching solution. The process is stopped when only a minute fraction of the original junction area remains. Due to differences between the characteristics of the material of the two end zones, the process may proceed more or less rapidly in the case of one junction than it does in the case of the other. To equalize the residual junction areas, or to control them individually, individual switches 15, 16 are provided to control the durations of the two operations individually.

Figure 2:
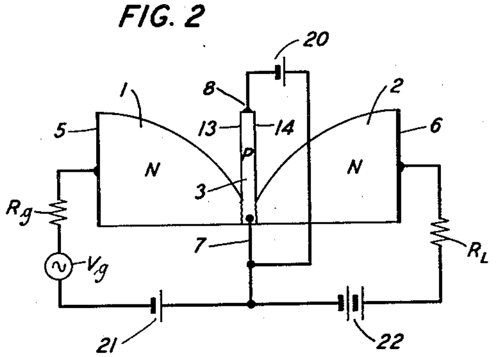
Fig. 2 shows a transistor constructed with the apparatus of Fig. 1 and connected for operation as a translating device in accordance with the invention.

Starting with a circuit element as minute as the N–P–N junction transistor, there is evidently a limit to the extent to which the active areas of the junctions may be reduced in this fashion. It has been so reduced from about one square millimeter to about 1/10 square millimeter. In accordance with the second aspect of the invention, a further great reduction in the electrically effective area of the emitter junction may be secured by connection of a bias battery 20, properly poled, between the main base electrode 7 and the auxiliary base electrode 8 as shown in Fig. 2. With a conventional N–P–N junction transistor, the emitter zone 1 is normally biased negatively with respect to the central base zone 3 by about 1/10 volt as by a battery 21 while the collector zone 2 is normally biased positively with respect to the same reference by about 20 volts, as by a battery 22. With this construction, it has been found that application of a negative voltage of about two volts to the auxiliary base connection 8 produces remarkable results. (In Fig. 2, as in other figures to follow, if the conductivity types of all three zones are reversed, as with P–N–P transistor, then the signs of all bias batteries are likewise to be reversed without change in their magnitudes).

Figure 3:
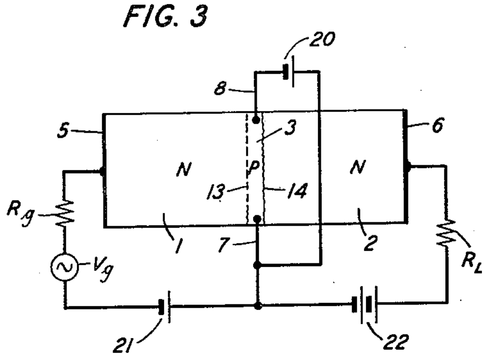
Fig. 3 shows a conventional N–P–N junction transistor to which an auxiliary base electrode has been added biased for operation as a translating device.

While the remarkable results to be described may be obtained with the apparatus of Fig. 2, they may also be obtained, for the most part, with an N–P–N transistor of conventional configuration as shown in Fig. 3 having N-type emitter and collector zones provided with emitter and collector connections and an intermediate P-type base zone to which, however, the auxiliary base connection has been added opposite to the main base connection and biased negatively by about two volts with respect to it. Each of these elements is numbered similarly to the corresponding element of Fig. 2.

Figure 4:
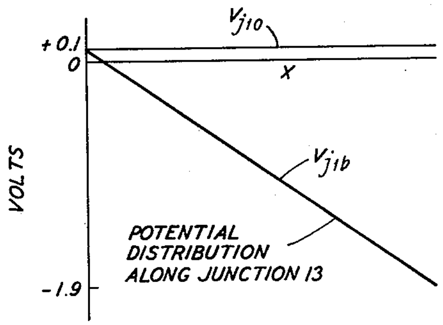
Fig. 4 shows the potential distribution along an emitter junction with and without the bias of the invention.

With the application to the normal emitter, base, and collector connections of biases of the signs and magnitudes just described, which may be derived from batteries and applied to the transistor electrodes by way of resistors $R_g$ and $R_L$, respectively, then, as shown in the curve $V_{j10}$ of Fig. 4, wherein the abscissa represents the length of the emitter junction, measured from the normal base connection toward the auxiliary base connection, a potential drop of about 1/10 volt exists across the emitter junction 13 at all parts thereof. The base resistance of the normal base connection as determined by external measurements may be regarded as the average of a large number of resistances, each of which connects the normal base connection to that part of the intermediate P-zone 3 which is closest to one part of the emitter junction 13. Some parts of this P-zone are close to the normal base connection 7, and so their resistances are small, while others are much further removed and consequently have much higher resistances.

Now when a negative voltage of two volts or so is applied, as from the battery 20, between the normal base connection 7 and the auxiliary base connection 8, the potential drop across the emitter junction 13 varies progressively in a direction transverse to the transistor or parallel with the direction of current flow through the central zone, as shown in the curve $V_{j1b}$ of Fig. 4. In particular, while the potential difference between the emitter zone 1 and the central zone 3 is, as before, 0.1 volt in the forward direction, close to the lower surface of the transistor of Fig. 3 and to the main base connection 7, it is rather 1.9 volts in the reverse direction close to its upper surface and adjacent the auxiliary base connection 8, varying progressively from one of these values to the other along the length of the emitter junction 13 and reaching the value zero at a point $\frac{1}{20}$ of this distance from the lower surface. It is well-known that, for charge injection in the transistor sense, the emitter zone 1 must be biased in the forward direction with respect to the base zone 3. Since only five per cent of the area of the emitter junction 13 is now forwardly biased, 95 per cent being reversely biased, it is reasonable to suppose that emitter action is restricted to that small fraction, e. g. five per cent, of the emitter junction 13 which is so forwardly biased. This fraction is indicated in Fig. 3 by a wavy line, the remainder of the original emitter junction 13 being indicated by a broken line.

This residual active area of the emitter junction is exceedingly close to the base connection and, without necessarily subscribing to any particular theory of operation, it appears that this proximity between the active part of the emitter junction and the base connection may be in some measure responsible for the observed great reduction in the effective base resistance of the new transistor. In particular, while junction transistors fabricated as described in the aforementined Teal application have base resistances which are of the order of 1000 ohms, the base resistance of a transistor such as that of Fig. 3, even at very high frequencies, has been found to be as low as 10 ohms.

The significance for high frequency operation of a reduction of base resistance, whether it be achieved by a mechanical or chemical reduction of the cross section of the emitter junction 13 of the transistor as in the case of Fig. 1 or Fig. 2, or by an auxiliary current and voltage drop lengthwise of the intermediate base zone 3 and transversely of the transistor or by both, may be seen from the following considerations.

Referring to the aforementioned article of R. L. Wallace, Jr., and W. J. Pietenpol published in the Bell System Technical Journal for July 1951, Equation 17 on page 544 gives the ratio of the output voltage of a junction transistor to its input voltage as $$\frac{V_2}{V_g}=\frac{\alpha R_L}{(r_e+r_b+R_g)\left(1+\frac{R_L}{r_c}\right)-\alpha r_b} \quad (1)$$

where $V_2$ is the output voltage as it appears across the load, $V_g$ is the voltage of the driving generator, $R_L$ is the resistance of the load, $r_e$ is the emitter resistance, $r_b$ is the base resistance, $r_c$ is the collector resistance, $R_g$ is the source resistance external to the transistor and $\alpha$ is the current multiplication factor of the transistor.

Due to transit time effects, the transistor output signal lags its input signal somewhat. This lag, which is unnoticeable at low frequencies, becomes important at high frequencies and it may be ascribed to a reactive component in the current multiplication factor $\alpha$. In particular, if $\alpha_0$ be the low frequency value of $\alpha$, and if $f_{c\alpha}$ be the frequency at which the magnitude of $\alpha$ is reduced to $$\frac{\alpha_o}{\sqrt{2}}$$

then for any particular frequency $f$, the value of $\alpha$ is given to a good approximation by $$\alpha(f)=\frac{\alpha_o}{1+j\frac{f}{f_{c\alpha}}} \quad (2)$$

In order to be specific, let us now consider a transistor in which $r_e$=25 ohms
$r_b$=1000 ohms
$r_c=10^7$ ohms
$\alpha_0$=0.99
$f_{c\alpha}=2.10^7$ cycles per second to be employed as a translating device of the grounded base configuration between a generator whose resistance $R_g$ is 25 ohms and a load $R_L$ of 500 ohms. The load has been chosen very small in comparison with the collector resistance in accordance with standard practice. This serves to prevent the effects of the collector capacitance from limiting high frequency operation.

Since, in this example, $$\frac{R_L}{r_c}\ll 1$$

Equation 1 reduces to $$\frac{V_2}{V_g}=\frac{\alpha R_L}{r_e+R_g+(1-\alpha)r_b} \quad (3)$$

If (2) is substituted into (3), the result reduces to $$\frac{V_2}{V_g}=\frac{\alpha_o R_L}{[r_e+R_g+(1-\alpha_o)r_b]+j\frac{f}{f_{c\alpha}}[r_e+R_g+r_b]} \quad (4)$$

which may be rewritten as $$\frac{V_2}{V_g}=\frac{\alpha_o R_L}{\sqrt{[r_e+R_g+(1-\alpha_o)r_b]^2+\left(\frac{f}{f_{c\alpha}}\right)^2[r_e+R_g+r_b]^2}}\epsilon^{-j\varphi} \quad (5)$$

where $$\varphi=\tan^{-1}\frac{\frac{f}{f_{c\alpha}}(r_e+R_g+r_b)}{r_e+R_g+(1-\alpha_o)r_b} \quad (6)$$

With the phase angle $\varphi$ we are not presently concerned. In the case of a tandem-connected amplifier, it is usually of no moment. In the case of an oscillator, while the phase angle between output and input is of vital significance, the present phase lag may be compensated by the insertion in the feedback path of a complementary phase shift as taught in A. J. Rack Patent 2,556,296, granted June 12, 1951.

The present concern is with the magnitude of the output voltage-input voltage ratio given by (4) or (5). It is a simple matter of algebraic manipulation to show that the frequency at which this ratio falls to 70.7 per cent of its low frequency value, i. e., by three decibels is related to the $\alpha$ cutoff frequency $f_{c\alpha}$ by the equation $$\frac{f}{f_{c\alpha}}=\frac{r_e+R_g+(1-\alpha_o)r_b}{r_e+R_g+r_b} \quad (7)$$

In other words, the frequency $f$ is that at which the tangent of the phase angle $\varphi$, given by (6), is equal to unity.

Inserting the chosen numerical values in (7) gives $$\frac{f}{f_{c\alpha}}=0.0572 \quad (8)$$

which indicates a severe restriction on the upper frequency limit of satisfactory operation. However, as explained above, the addition of the auxiliary base connection and the application of the base-to-base bias effective reduces the base resistance to about 10 ohms. Inserting the value 10 ohms for $r_b$ in place of 1000 ohms in (7) and making no other change, gives $$\frac{f}{f_{c\alpha}}=0.835 \quad (9)$$

Inserting the value of $f_{c\alpha}$ from the table above in (8) and (9) gives, for the conventional N–P–N transistor a high frequency cutoff of 1.14 megacycles per second and for the transistor of the invention a high frequency cutoff of 16.7 megacycles per second. This represents an improvement of 15 to 1.

In the foregoing analysis the low frequency value of the current multiplication factor $\alpha_o$ has been assumed to be constant. Measurements to date indicate that this is not strictly true and the transverse base-to-base current, in addition to providing the reduction in base resistance as explained above, also somewhat reduces the value of $\alpha_o$, which in turn of course diminishes the low frequency gain of the transistor amplifier by 2 or 3 decibels. For high frequency operation this is in fact an advantage as can be seen from (7) which shows that a reduction in $\alpha_0$ results in an increase in the magnitude of $$\frac{f}{f_{c\alpha}}$$

Figure 5:
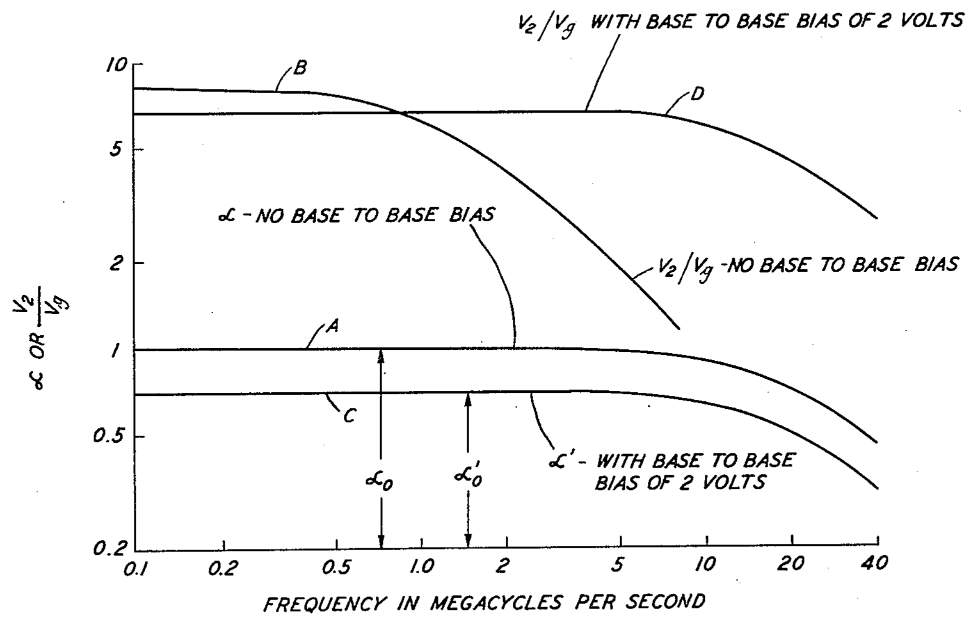
Fig. 5 is a set of curves showing the variation of current multiplication factor and of output-input voltage ratio with and without benefit of the invention.

In the curves of Fig. 5 which illustrate these results, the curve A shows the variation of $\alpha$ with frequency for an N–P–N junction transistor before the addition of the base-to-base bias of the invention. Its low frequency value $\alpha_0$ is very slightly less than unity. Commencing at a frequency of about 3 megacycles per second, it begins to fall in amplitude, being reduced to 70 per cent of its original amplitude at 20 megacycles per second. The curve B shows the corresponding variation of the voltage ratio given by (1). Starting with a magnitude of 8.0 at low frequencies it commences to fall at about 0.3 megacycle per second, falling to 70 per cent of its low frequency value at a frequency slightly in excess of one megacycle per second and continuing to fall thereafter with a slope of approximately 6 decibels per octave.

The curve C shows the frequency variation of $\alpha$ for the junction transistor to which has been added the auxiliary base contact and the base-to-base voltage and transverse current. It may be denoted $\alpha'$. Its low frequency value $\alpha'_0$ is less than the original low frequency value $\alpha_0$ but it follows the same trend, falling to 70 per cent of its low frequency value at 20 megacycles per second.

The curve D shows the frequency variation of the voltage ratio given by (4) or (5), and shows the great improvement which is achieved by the practice of the invention. While its low frequency value is about 6.5 as compared with 8.0 for the curve B, it does not commence to fall until a frequency of about 5 megacycles per second is reached, falling to 70 per cent of its low frequency value at a frequency of 16.7 megacycles per second.

This frequency, at which the curve D falls to 70 per cent of its low frequency value, is termed the high frequency "cutoff" of the amplifier which includes the improved transistor as its active element. The 70 per cent relation is convenient for computation, but it of course does not indicate that the transistor is inoperative at higher frequencies. On the contrary, with a sufficiently large gain at low frequencies, and a 70 per cent of this large gain remaining at 20 megacycles per second, and with decrease of gain at still higher frequencies at the rate of about 6 decibels per octave, there may well remain a substantial amount of gain several octaves above this cutoff frequency. This has been confirmed experimentally.

Figure 6:
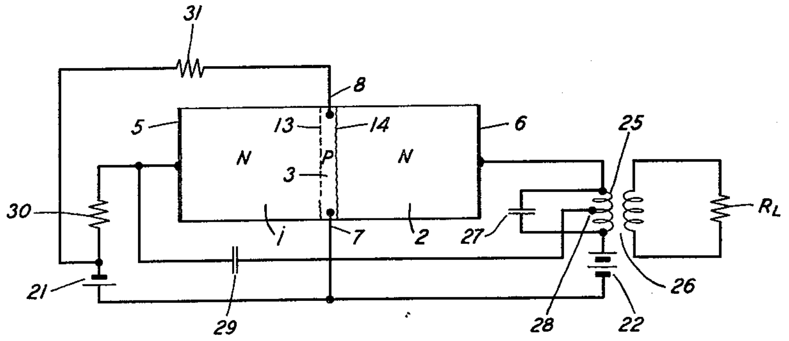
Fig. 6 shows the translating device of Fig. 3 with controlled-frequency feedback from its output to its input and serving as a self-oscillator.

A convenient way of securing unequivocal experimental confirmation of the fact that the high frequency operation limits have been very greatly increased by the practice of the invention is to feed energy back from the collector connection as output electrode to the emitter connection as input electrode and observe that sustained self-oscillations take place. Fig. 6 shows a transistor in accordance with the invention connected as an oscillator. The frequency is determined by a parallel resonant circuit comprising the primary winding 25 of a transformer 26 and a condenser 27 connected from the collector connection 6 to ground. A fraction of the voltage developed across this tuned circuit is picked off an intermediate tap 28 on the primary winding 25 and applied by way of a condenser 29 to the emitter connection 5. The condenser 29 serves in part as a phase-advance device to compensate for the phase lag in the transistor due to transit time effects. A forward bias of about 0.1 volt is applied from the normal base connection 7 which may be grounded, to the emitter connection 5. It is derived as from a battery 21 of perhaps 10 volts, the voltage being dropped to 0.1 volt by a resistor 30. The 2-volt bias of appropriate sign for the auxiliary base electrode 8 may conveniently be derived from the emitter bias battery 21 and dropped to 2 volts by way of another resistor 31. Operating bias is applied as from a battery 22 to the oscillator circuit in any desired fashion, for example by way of the primary winding 25.

The foregoing analysis of the effects of the base-to-base bias and the transverse current in reducing the effective area of the emitter junction, and so the transistor base resistance, applies to an emitter junction of any size, large or small, including an emitter junction which has already been reduced in its physical size by the etching process described in connection with Fig. 1. While the junction area may be reduced independently either physically as by etching or effectively as by the application of the base-to-base bias, it is preferred to employ both of these devices together, reducing both junctions as far as is feasible physically and then pursuing the effective reduction still further by way of the bias approach. The first step offers advantages in the way of reduction of input and output capacities while the second permits a further reduction of the effective area of the emitter junction which is far beyond what is possible to secure physically as by etching or any other known means.

Figure 7:
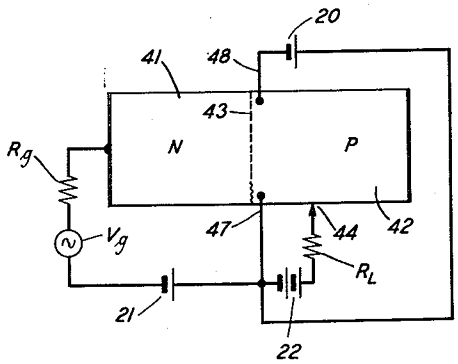
Fig. 7 shows a single-junction transistor provided with an auxiliary base electrode and with the base-to-base bias of the invention.

While the invention is believed to be particularly applicable to N–P–N (or P–N–P) transistors, it is not exclusively restricted thereto. Fig. 7 shows its application to a single-junction transistor comprising two contiguous zones of which the first 41 is N-type and the second 42 is P-type. The emitter connection is by way of the junction 43 between these zones and the collector connection is by way of a point contact 44. The normal base electrode 47 is connected to the P-type zone, preferably close to the junction 43 while the auxiliary base connection 48 is likewise connected to the P-type zone and close to the junction but located opposite to the main connection 47. This construction sacrifices the advantage which is obtainable by the use of a double-junction transistor in that substantially more current must flow through the P-type zone 42 due to the base-to-base bias voltage in order to produce a potential distribution along the junction of the type described above in which the greater part of the area of the junction is disabled, leaving only a small fraction of this area located close to the normal base contact, in operation as an emitter.

Figures 8, 9:
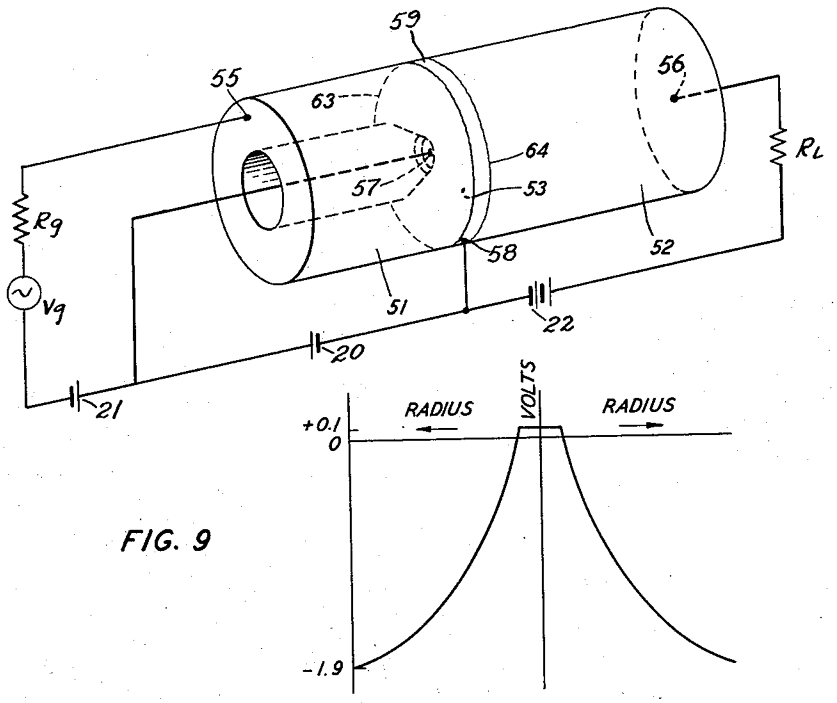
Fig. 8 shows an alternative construction to the transistor of Fig. 3.
Fig. 9 shows the radial potential distribution along the emitter junction of the transistor of Fig. 8.

Fig. 8 shows another alternative to Fig. 3 which differs principally in that one of the base electrodes surrounds the other so as to cause the base-to-base current to flow through the intermediate zone in a radial direction. The figure shows an N–P–N junction transistor as fabricated for example in accordance with the teachings of the aforementioned application of G. K. Teal comprising an emitter zone 51 and a collector zone 52 which may be of N-type material with an intermediate base zone 53 of P-type material. An axial hole has been formed as by drilling through the end of the emitter zone 51, through the emitter junction 63 and into the body of the P-type zone 53, where a first base contact 57 is connected, preferably ohmically, to the P-type zone 53. The axial hole may have a wide conical angle as shown for the sake of safety in manipulation, although this is of no importance from the standpoint of the operation of the device when completed. It is, however, desirable that the diameter of the axial hole where it pierces the emitter junction 63 be only very slightly in excess of the diameter of the base connection 57 itself.

Emitter and collector connections 55, 56 are made to the ends of the N-type zones 51, 52 as by plating in the customary fashion. In addition an auxiliary base connection 58 is made to the periphery of the intermediate P-type zone 53 and preferably on all sides thereof. It may conveniently be connected to a plated metal ring 59.

The external connections, including bias batteries source and load may be the same as those described above and are similarly numbered.

With this construction the current of the base-to-base bias battery 20 flows out radially from the central base electrode 57 to the peripheral base electrode 58 in all directions. This current is therefore most dense near the center of the intermediate P-type zone 53 and least dense at its periphery and gives rise to potential distribution as shown in Fig. 9, the gradient being steepest close to the central base electrode 57. By virtue of the principles discussed above in connection with Fig. 4, it will be understood that, the emitter zone 51 being biased in the forward direction by a small amount, e. g. 0.1 volt, and the auxiliary base electrode 58 being biased negatively with respect to the main base electrode 57 by about 2 volts (or, for a P–N–P transistor, positively) the major part of the emitter junction 63 is disabled, the only part remaining active as an injector of charges being a ring of minute width immediately surrounding the central base electrode 57. Furthermore, this minute area lies in immediate proximity with the main base electrode 57, from which follow all the desirable results discussed above in connection with Fig. 3. At the same time and by virtue of the potential distribution shown in Fig. 9, this construction takes advantage of the steep gradient which obtains close to the main base electrode 57 without requiring nearly so large a base-to-base bias voltage as would be required if the same steep slope were to continue through the full radial distance from the main base electrode 57 to the auxiliary base electrode 58.

Figure 10:
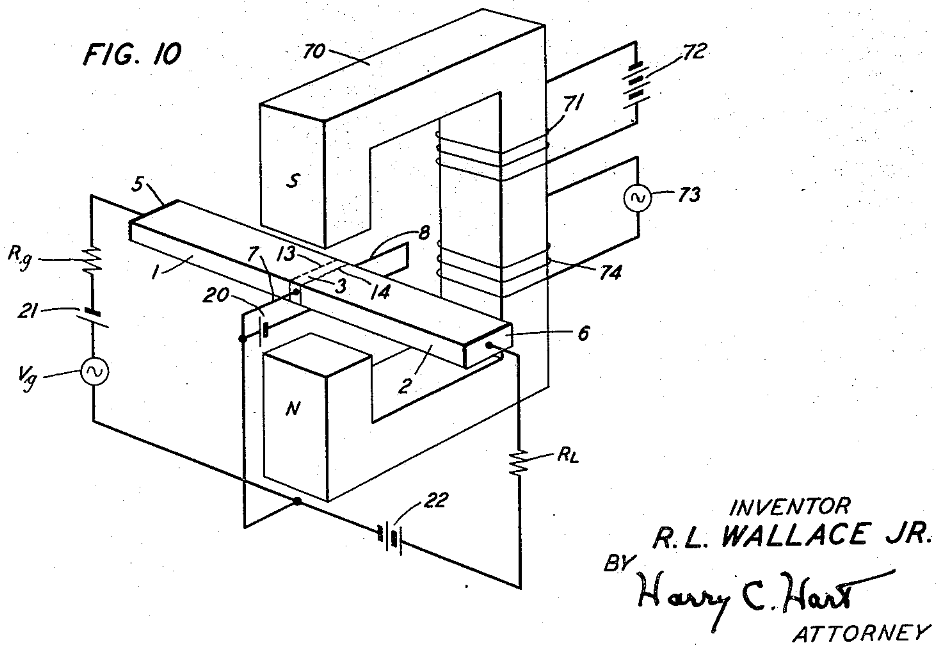
Fig. 10 shows a modification of Fig. 3 employing an auxiliary magnetic field.

Still further improvement in the high frequency cutoff of an N–P–N transistor may be secured by the addition to it of a magnetic field perpendicular to the transistor face in the manner shown in Fig. 10. Inasmuch as the base-to-base bias produces an electric field parallel to the direction of bias current flow; i. e., laterally in the intermediate zone 3, this lateral electric field gives rise to a component of the movement of charges injected at the emitter junction which is likewise lateral. These lateral currents may be deflected in the direction of the collector junction by the application of a magnetic field, derived, for example, from an iron core 70 provided with a winding 71 energized by a battery 72. The field should be perpendicular to the direction of the bias current flow and also to the line joining the emitter connection 5 to the collector connection 6. Such deflection of this current results in a reduction of the transit time of the mobile charges injected at the residual active area of the emitter junction 13 which would otherwise reach the collector junction 14 only by the diffusion process, accelerated by any influence which the base-to-base bias may have on the transit time. A substantial increase in the high frequency cutoff of the transistor has been observed to be secured by this means, and it is attributed to a reduction in mobile charge transit time across the intermediate zone 3 due to such deflection.

The apparatus of Fig. 10 lends itself to use as a transit time modulator, the application of the voltage modulating source 73 to an additional winding 74 on the magnetic core acting to modify the Hall effect deflection and therefore the mobile charge transit time across the intermediate zone.

What is claimed is:

1. A signal translating device which comprises a body of semiconductive material having therein a first zone of one conductivity type and a second zone of opposite conductivity type forming a junction with the first zone, said junction being disposed in a plane substantially normal to the longest dimension of said body, an emitter connection to the first zone, a base connection to the second zone adjacent said junction, and a collector connection elsewhere on the body, said body being provided with an acute angled recess extending laterally into one side of the body in the material of said first zone, parallel with said junction and contiguous with the material of said second zone, toward and more than half way to the other side of the body, the apex of said recess being proximate to said base connection, whereby the conductive area of said junction is reduced to a minor fraction of the area of said second zone that is coplanar therewith and the mean path length from said emitter connection to said base connection is minimized.

2. In combination with apparatus as defined in claim 1, an auxiliary base connection to an opposite part of said second zone, means including a potential source for applying a small forward bias to the emitter connection with respect to the first-named base connection, means including a potential source for applying a reverse bias to the collector connection, and means including a source of steady potential for applying to said auxiliary base connection a bias of the same sign as the bias applied to said emitter connection and sufficiently larger than said emitter bias as to disable from functioning as an emitter junction all of the conductive area of said first junction except for a minor fraction thereof which is most proximate to the first-named base connection, thereby further to reduce the mean path length from said emitter connection to said first-named base connection.

3. A signal translating device which comprises a body of semiconductive material having therein a first and a second zone of one conductivity type and a third zone of opposite conductivity type disposed between said first and second zones and forming a first junction with said first zone and a second junction with said second zone, said junctions being disposed in planes substantially normal to the longest dimension of said body, an emitter connection to the first zone, a base connection to the third zone adjacent said first junction, and a collector connection to the second zone, said body being provided with an acute angled recess extending laterally into one side of the body in the material of one of said first two named zones, parallel with said junctions and contiguous with the material of said third zone, toward and more than half way to the other side of the body, the apex of said recess being proximate to said base connection, whereby the conductive area of one of said junctions is reduced to a minor fraction of the area of said third zone which is coplanar therewith, and the mean path length from said base connection to one of said two other connections is minimized.

4. A signal translating device which comprises a body of semiconductive material having therein a first and a second zone of one conductivity type and a third zone of opposite conductivity type disposed between said first and second zones and forming a first junction with said first zone and a second junction with said second zone, said junctions being disposed in planes substantially normal to the longest dimension of said body, an emitter connection to the first zone, a base connection to the third zone adjacent said first junction, and a collector connection to the second zone, said body being provided with an acute angled recess extending laterally into one side of the body in the material of said first zone, parallel with said first junction and contiguous with the material of said third zone, toward and more than half way to the other side of the body, the apex of said recess being proximate to said base connection, whereby the conductive area of said first junction is reduced to a minor fraction of the area of said body which is coplanar therewith and the mean path length from said emitter connection to said base connection is minimized.

5. A signal translating device which comprises a body of semiconductive material having therein a first zone of one conductivity type and a second zone of opposite conductive type disposed colinearly on the major axis of the body, said second zone forming a junction with the first zone, said junction being disposed in a plane substantially normal to said major axis and having a geometrical area equal to the cross-sectional area of the body normal to its major axis, an emitter connection to the first zone, a normal base connection to one part of the second zone adjacent to said junction, an auxiliary base connection to an opposite part of said second zone, and a collector connection elsewhere on the body, said base connections being disposed on an axis which is normal to said major axis, means including a potential source for applying a small forward bias to the emitter connection with respect to the normal base connection, means including a potential source for applying a reverse bias to said collector connection, and means including a source of steady potential for applying to said auxiliary base connection a bias of the same sign as the bias applied to said emitter connection and sufficiently larger than said emitter bias as to disable from functioning as an emitter junction all of the area of said junction except for a minor fraction thereof which is most proximate to said main base connection.

6. A signal translating device which comprises a body of semiconductive material having therein a first and a second zone of one conductivity type disposed on the major axis of the body, and a third zone of opposite conductivity type between said first and second zones and forming a first junction with the first zone and a second junction with the second zone, said junctions being disposed in parallel alignment normal to said major axis and having geometrical areas equal to the cross-sectional area of the body normal to its major axis, an emitter connection to the first zone, a collector connection to the second zone, a normal base connection to one part of the third zone adjacent to said first-named junction, an auxiliary base connection to an opposite part of said third zone, said base connections being disposed on an axis which is normal to said major axis, means including a potential source for applying a small forward bias to the emitter connection with respect to the normal base connection, means including a potential source for applying a reverse bias to said collector connection, and means including a source of steady potential for applying to said auxiliary base connection a bias of the same sign as the bias applied to said emitter connection and substantially larger than said emitter bias, said bias-applying means acting together to bias a minor fraction of the area of said first junction in the forward direction and the remainder of the area of said first junction in the reverse direction, said minor fraction being proximate to said main base connection.

7. A signal translating device which comprises a body of semiconductive material having therein a first and a second zone of one conductivity type disposed on the major axis of the body, and a third zone of opposite conductivity type between said first and second zones and forming a first junction with the first zone and a second junction with the second zone, said junctions being disposed in parallel alignment normal to said major axis and having geometrical areas equal to the cross-sectional area of the body normal to its major axis, an emitter connection to the first zone, a collector connection to the second zone, a normal base connection to one part of the third zone adjacent to said first-named junction, an auxiliary base connection to an opposite part of said third zone, said base connections being disposed on an axis which is normal to said major axis, means including a potential source for applying a small forward bias to the emitter connection with respect to the normal base connection, means including a potential source for applying a reverse bias to said collector connection, and means including a source of steady potential for applying to said auxiliary base connection a bias of the same sign as the bias applied to said emitter connection and sufficiently larger than said emitter bias as to disable from functioning as an emitter junction all of the area of said first junction except for a minor fraction thereof which is most proximate to said main base connection.

8. In combination with apparatus as defined in claim 7, means for establishing a magnetic field in a direction normal both to the major axis of the body and to the line joining said normal and auxiliary base connections, thereby to deflect said auxiliary current toward said second junction.

9. Apparatus as defined in claim 7 wherein the main base connection is located on the major axis of the body and the auxiliary base connection makes contact with the body substantially throughout the periphery of the third zone.

10. Apparatus as defined in claim 9 wherein the body is provided with a recess extending through the first zone and through the first junction to admit a wire to said normal base connection.

References Cited in the file of this patent

UNITED STATES PATENTS

| Number | Name | Date |
|---|---|---|
| 2,502,479 | Pearson et al. | Apr. 4, 1950 |
| 2,553,491 | Shockley | May 15, 1951 |
| 2,560,579 | Kock et al. | July 17, 1951 |
| 2,560,594 | Pearson | July 17, 1951 |
| 2,563,503 | Wallace | Aug. 7, 1951 |
| 2,569,347 | Shockley | Sept. 25, 1951 |
| 2,600,500 | Haynes et al. | June 17, 1952 |